United States Patent
Kim et al.

(10) Patent No.: US 10,847,713 B2
(45) Date of Patent: Nov. 24, 2020

(54) CRYOGENIC OXIDATION OF METAL LAYER OF MAGNETIC-TUNNEL-JUNCTION (MTJ) DEVICE

(71) Applicant: SAMSUNG ELECTRONICS CO., LTD., Suwon-Si (KR)

(72) Inventors: Whan Kyun Kim, Seoul (KR); Eun Sun Noh, Yongin-Si (KR); Joon Myoung Lee, Anyang-Si (KR); Woo Chang Lim, Seongnam-Si (KR); Jun Ho Jeong, Hwaseong-Si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/403,320

(22) Filed: May 3, 2019

(65) Prior Publication Data
US 2019/0355900 A1    Nov. 21, 2019

(30) Foreign Application Priority Data
May 18, 2018   (KR) .................. 10-2018-0057058

(51) Int. Cl.
| | | |
|---|---|---|
| *H01L 43/00* | (2006.01) | |
| *H01L 43/12* | (2006.01) | |
| *H01L 43/02* | (2006.01) | |
| *H01L 27/12* | (2006.01) | |
| *G11C 11/16* | (2006.01) | |
| *H01L 43/10* | (2006.01) | |

(52) U.S. Cl.
CPC ............ *H01L 43/12* (2013.01); *G11C 11/161* (2013.01); *H01L 27/1222* (2013.01); *H01L 43/02* (2013.01); *H01L 43/10* (2013.01)

(58) Field of Classification Search
CPC ................................ H01L 43/12; H01L 43/02
See application file for complete search history.

(56) References Cited

U.S. PATENT DOCUMENTS

| | | | | |
|---|---|---|---|---|
| 4,370,640 | A * | 1/1983 | Dynes ....................... | G01J 5/20 338/25 |
| 6,143,081 | A | 11/2000 | Shinriki et al. | |
| 7,037,560 | B1 | 5/2006 | Shinriki et al. | |
| 8,776,542 | B2 * | 7/2014 | Endo ....................... | H01J 37/34 62/259.2 |
| 8,992,685 | B2 | 3/2015 | Kato et al. | |
| 9,905,441 | B2 | 2/2018 | Shimane et al. | |
| 10,101,061 | B2 * | 10/2018 | Eguchi ....................... | C01G 5/00 |
| 2011/0062537 | A1 * | 3/2011 | Oh ....................... | G11C 11/16 257/421 |

(Continued)

FOREIGN PATENT DOCUMENTS

| | | |
|---|---|---|
| JP | 3062116 | 4/2000 |
| JP | 3062116 B2 | 7/2000 |

(Continued)

*Primary Examiner* — Caridad Everhart
*Assistant Examiner* — Ankush K Singal
(74) *Attorney, Agent, or Firm* — Volentine, Whitt & Francos, PLLC

(57) ABSTRACT

A method is for manufacturing a magnetic-tunnel-junction (MTJ) device. The method includes forming a free magnetic layer over a substrate, forming a metal layer over the free magnetic layer, and oxidizing the metal layer by exposing the metal layer to an oxidation gas at a temperature of 250° K or less.

19 Claims, 23 Drawing Sheets

(56) References Cited

U.S. PATENT DOCUMENTS

2018/0047548 A1 2/2018 Berry et al.
2018/0073131 A1* 3/2018 Lee .................. H01J 37/32724

FOREIGN PATENT DOCUMENTS

| JP | 2002064090 A | 2/2002 |
| JP | 2008041716 A | 2/2008 |
| JP | 4463583 | 2/2010 |
| JP | 4463583 B2 | 5/2010 |
| JP | 2010235975 A | 10/2010 |
| JP | 5255470 | 4/2013 |
| JP | 5255470 B2 | 8/2013 |
| JP | 5447632 | 1/2014 |
| JP | 5447632 B2 | 3/2014 |
| KR | 20190060545 A | 6/2019 |

* cited by examiner

CRYOGENIC OXIDATION OF METAL LAYER OF MAGNETIC-TUNNEL-JUNCTION (MTJ) DEVICE

A claim of priority is made to Korean Patent Application No. 10-2018-0057058, filed May 18, 2018, in the Korean Intellectual Property Office, the disclosure of which is incorporated herein in its entirety by reference.

BACKGROUND

The present disclosure relates to the oxidation of a metal layer during fabrication of a magnetic-tunnel-junction (MTJ) device. In addition, the present disclosure relates to an MTJ device, and to a wafer processing apparatus.

In order to form a magnetic tunnel junction (MTJ) structure of a magnetoresistive random access memory (MRAM), a metal layer deposited on a free magnetic layer may be oxidized to form an oxide layer.

SUMMARY

According to one aspect of the present disclosure, method of manufacturing a magnetic-tunnel-junction (MTJ) device is provided. The method includes forming a free magnetic layer over a substrate, forming a metal layer over the free magnetic layer, and oxidizing the metal layer by exposing the metal layer to an oxidation gas at a temperature of 250° K or less.

According to another aspect of the present disclosure, a magnetic-tunnel-junction (MTJ) device is provided. The MTJ device includes a substrate, a lower electrode located over the substrate, a fixed magnetic layer located over the lower electrode, a tunnel barrier layer located over the fixed magnetic layer, a free magnetic layer located over the tunnel barrier layer, an oxidized metal layer located over the free magnetic layer, and an upper electrode located over the oxidized metal layer. A surface roughness the oxidized metal layer is less than or equal to 0.37 nm.

According to yet another aspect of the present disclosure, a wafer processing apparatus is provided. The wafer processing apparatus includes a chamber, an electrostatic chuck located within the chamber and configured to support a substrate, a shower head for injecting an oxidation gas over the electrostatic chuck, and a cooling plate located below and thermally coupled to the electrostatic chuck. The shower head includes a central portion and a peripheral portion surrounding the central portion, and the injection of the oxidation gas is independently controlled for each of the central portion and the peripheral portion of the shower head.

BRIEF DESCRIPTION OF THE DRAWINGS

The above and other aspects and features of the present disclosure will become readily apparent from the detailed description that follows, with reference to the accompanying drawings, in which.

DETAILED DESCRIPTION OF THE EMBODIMENTS

Figure 1:
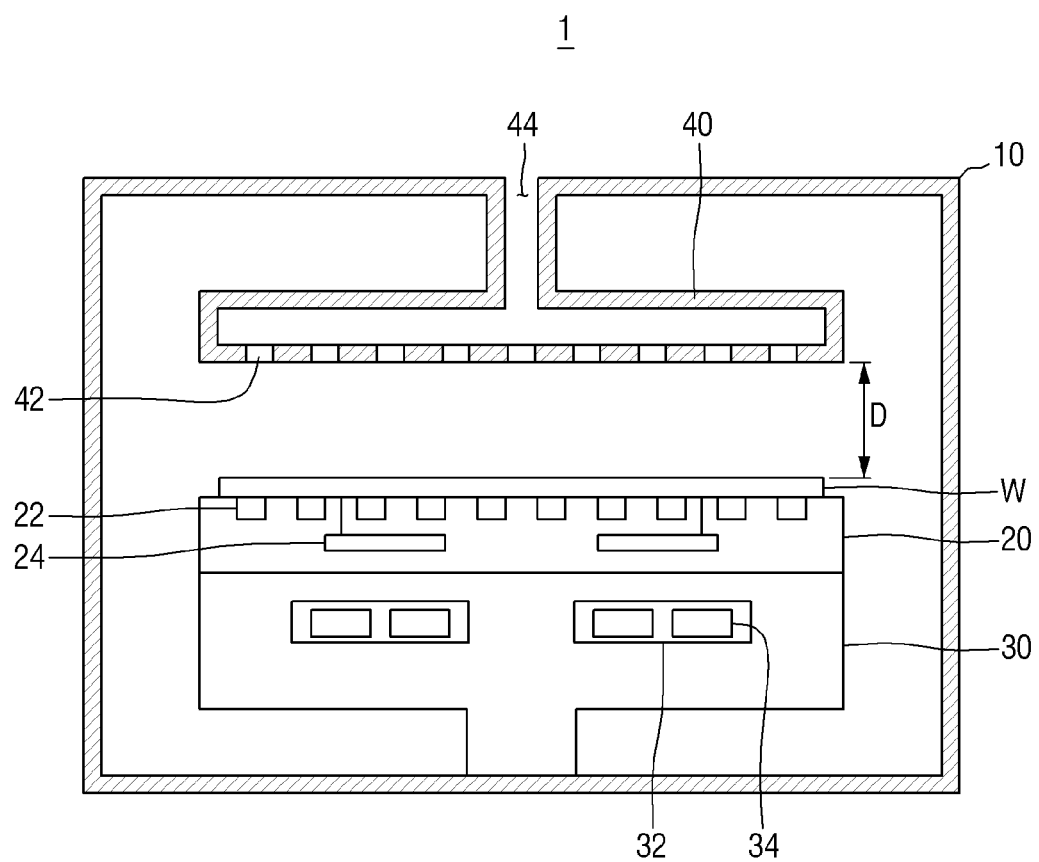
FIG. 1 is a cross-sectional view for reference in describing a wafer processing apparatus according to an embodiment of the present disclosure.

FIG. 1 is a cross-sectional view for reference in describing a wafer processing apparatus 1 according to an embodiment of the present disclosure.

A wafer processing apparatus 1 according to an embodiment of the present disclosure may be utilized in the fabrication of a semiconductor device on a wafer W. In particular, according to the example of the present embodiment, the wafer processing apparatus 1 may be utilized during the formation of a magnetoresistive memory device (e.g., an MRAM: magnetoresistive random access memory) on the wafer W.

For example, the wafer processing apparatus may be used to form an oxide layer of a magnetic tunnel junction (MTJ) structure of the magnetoresistive memory device. The oxide layer may be formed by oxidizing a metal layer deposited on a free magnetic layer located on the wafer W. Here, the oxide layer may contain a metal oxide having insulating properties. In some embodiments of the present disclosure, the oxide layer may include tantalum oxide (TaO), zirconium oxide (ZrO), titanium oxide (TiO), vanadium oxide (VO), yttrium oxide (YO), scandium oxide (ScO), molybdenum oxide (MoO), magnesium oxide (MgO), cobalt oxide (CoO), and the like. Such a magnetic tunnel junction structure will be described in more detail later with reference to FIGS. 14 to 17.

Referring to FIG. 1, the wafer processing apparatus 1 may include a chamber 10, an electrostatic chuck 20 disposed inside the chamber 10, a cooling plate 30, and an oxidizing gas injector 40.

The chamber 10 provides a space for cooling and oxidation of the wafer W. In some embodiments of the disclosure, the chamber 10 may be made of a metallic material and may be electrically grounded. The chamber 10 may be equipped with additional components not shown, such as a vacuum pump for adjusting a pressure inside the chamber 10 to a desired degree of vacuum, an exhaust port for discharging reaction byproducts generated during processing, and the like. These and other additional components may be located inside and/or outside the chamber 10.

The electrostatic chuck 20 supports the wafer W during processing. In particular, the electrostatic chuck 20 may electrostatically attract the wafer W to fix a position of the wafer W within the chamber 10. To this end, the electrostatic chuck 20 may include an electrostatic electrode (not shown) for generating an electrostatic force acting on the wafer W in response to an externally supply power.

In some embodiments of the present disclosure, the electrostatic chuck 20 may also function to cool the wafer W during processing. In this case, a coolant passage 22 may be formed at or near the surface of the electrostatic chuck 20. The coolant passage 22 may receive a supply of cooling fluid from a coolant source (e.g. a coolant pump) that may be located outside the chamber 10. The cooling fluid flowing through the coolant passage 22 may absorb heat from the wafer W to cool the wafer W to a desired processing temperature. In some embodiments of the present disclosure, the cooling fluid may include a cooling gas such as helium (He) and argon (Ar).

In addition, in some embodiments of the present disclosure, the electrostatic chuck 20 may include a lift mechanism 24 for lowering the wafer W onto the electrostatic chuck 20, and for raising the wafer W up off the electrostatic chuck 20. The lift mechanism 24 may, for example, be constituted by one or more lift pins which engage a lower surface of the wafer W. Further, although not shown, a rotation driving device for rotating the electrostatic chuck 20 and wafer W during processing may be additionally provided.

The cooling plate 30 is disposed under the electrostatic chuck 20 and functions to further cool the wafer W to cryogenic temperatures (e.g., equal to or less than 260° K). The cooling plate 30 may be configured in the shape of a disk corresponding to the shape and diameter of the electrostatic chuck 20. In some embodiments of the present disclosure, the cooling plate 30 may be made of a conductive material, and may be connected to a power supply or grounded.

In some embodiments of the present disclosure, the cooling plate 30 may include a cooling section 32 having one or more cooling channels 34 containing a cooling fluid circulating there through. The cooling fluid flows to cool the wafer W (i.e., draw heat from the wafer W) through the electrostatic chuck 20 having the wafer W adhered thereto. Since the cooling channels 34 may receive supply of the cooling fluid from a cooler (e.g., a cooling pump) that may be installed outside the chamber 10, the cooling channels 34 may absorb significant heat from the electrostatic chuck 20, and allow the wafer W to be cooled to cryogenic temperatures.

In the wafer processing apparatus 1, the electrostatic chuck 20 may be referred to as an upper plate and the cooling plate 30 may be referred to as a lower plate.

The gas injector 40 may inject oxidizing gas for oxidizing the metal layer formed on the wafer W. The gas injector 40 may include a plurality of injection holes 42 for injecting the oxidizing gas to the wafer W. Further, the gas injector 40 may receive the supply of oxidizing gas from the gas supply device which may be disposed outside the chamber 10 through the oxidizing gas supply passage 44.

In some embodiments of the present disclosure, the oxidizing gas may include oxygen or a mixture or compound containing oxygen. For example, the oxidizing gas may include $O_2$, $Ar/O_2$, $O_3$, and the like. In some embodiments of the present disclosure, the oxidizing gas may be supplied to the metal layer formed on the wafer W at a low flow rate of 10 sccm level.

In the present embodiment, the gas injector 40 may be disposed over the upper part of the wafer W. In the case of oxidizing the metal layer formed on the wafer W with natural gas such as oxygen gas as described above, when the oxidizing gas is injected from the lower part or the side part of the wafer W, it was difficult to obtain low in-chip distribution for the magnetic tunnel junction or to achieve uniform oxidation. Accordingly, in various embodiments of the present disclosure, by disposing the gas injector 40 on the upper part of the wafer W, it is possible to maintain a low chip distribution for the magnetic tunnel junction and to achieve uniform oxidation.

Furthermore, in this embodiment, a distance D between the upper surface of the wafer W and the lower surface of the oxidizing gas injector 40 may be a range of 10 mm to 30 mm (both inclusive). If the distance D between the upper surface of the wafer W and the lower surface of the oxidizing gas injector 40 falls outside this range, it may be difficult to obtain a low chip distribution for the magnetic tunnel junction or achieve uniform oxidation. Therefore, in various embodiments of the present disclosure, by setting the distance D between the upper surface of the wafer W and the oxidizing gas injector 40 to 10 mm≤D≤30 mm, it is possible to maintain the low chip distribution for the magnetic tunnel junction and achieve uniform oxidation.

Figure 2:
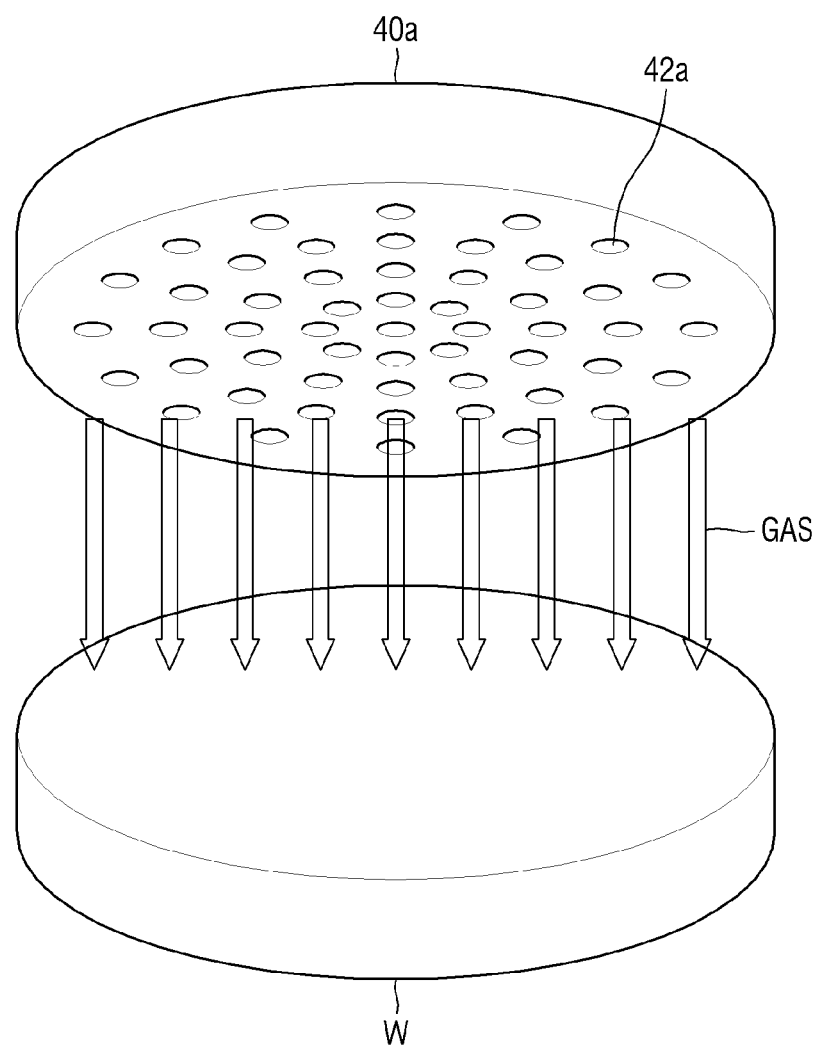
FIG. 2 is a diagram for reference in describing an example of an oxidizing gas injector which may be used in the wafer processing apparatus of FIG. 1.
Figure 3:
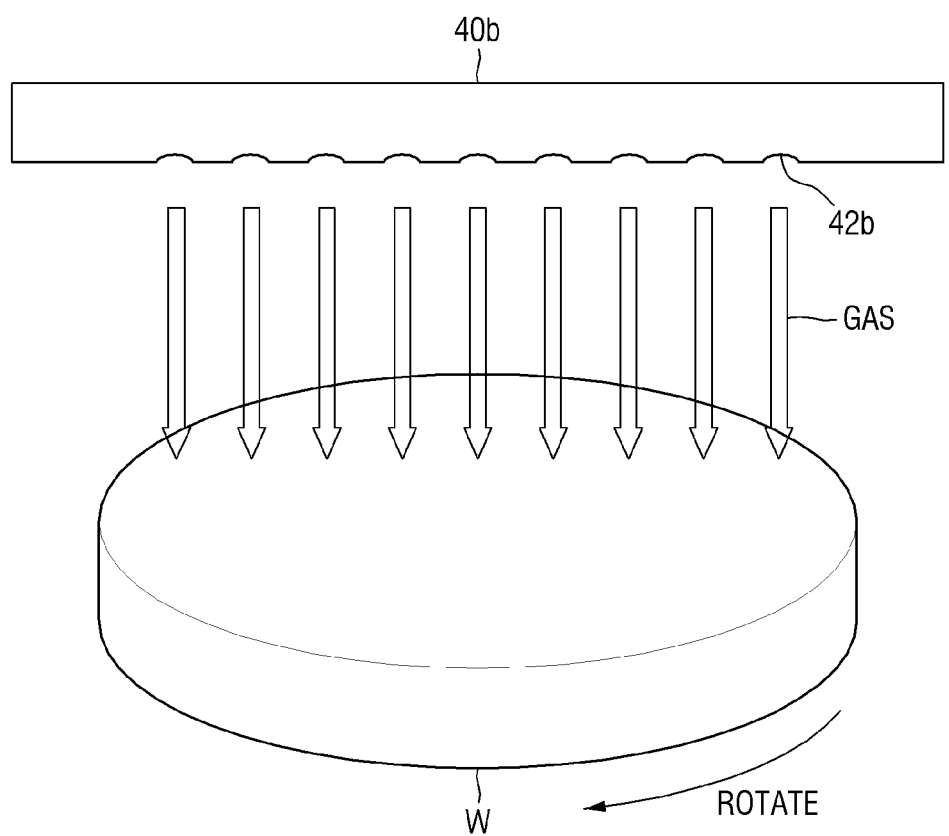
FIG. 3 is a diagram for reference in describing another example of an oxidizing gas injector which may be used for the wafer processing apparatus of FIG. 1.

FIG. 2 is a diagram for reference in explaining an example of an oxidizing gas injector which may be used for the wafer processing apparatus of FIG. 1, and FIG. 3 is a diagram for reference in explaining another oxidizing gas injector which may be used for the wafer processing apparatus of FIG. 1.

Referring to FIG. 2, a shower head type oxidizing gas injector 40a is illustrated as an oxidizing gas injector which may be used in the wafer processing apparatus of FIG. 1. The shower head type oxidizing gas injector 40a includes a plurality of injection holes 42a dispersed along the surface of a circular plate. The shower head type oxidizing gas injector 40a injects the oxidizing gas onto the wafer W through the plurality of injection holes 42a.

In some embodiments of the present disclosure, the plurality of injection holes 42a may be arranged in any of a variety of different patterns. For example, the plurality of injection holes 42a may be disposed only adjacent the edge of the shower head type oxidizing gas injector 40a, unlike the configuration illustrated in FIG. 2. In addition, the plurality of injection holes 42a may be formed in an arbitrary arrangement, unlike the configuration illustrated in FIG. 2.

FIG. 2 illustrates an example in which the electrostatic chuck 20 does not rotate while the oxidizing gas is injected from the shower head type oxidizing gas injector 40a, but the scope of the present disclosure is not limited thereto. That is, unlike the configuration illustrated in FIG. 2, while the oxidizing gas is injected from the shower head type oxidizing gas injector 40a, the electrostatic chuck 20 may rotate under control of rotation driving device described above. As a result, the oxidizing gas may be sufficiently injected into the entire region of the wafer W.

Next, referring to FIG. 3, a pipe type oxidizing gas injector 40b is illustrated as another oxidizing gas injector which may be used in the wafer processing apparatus of FIG. 1. The pipe type oxidizing gas injector 40b includes a plurality of injection holes 42b arranged in a line along a pipe. The pipe type oxidizing gas injector 40b injects the oxidizing gas onto the wafer W through the plurality of injection holes 42b. While the oxidizing gas is being injected from the pipe type oxidizing gas injector 40b, the electrostatic chuck 20 may rotate under control of the previously described rotation driving device. As a result, the oxidizing gas may be sufficiently injected to the entire region of the wafer W.

Figure 4:
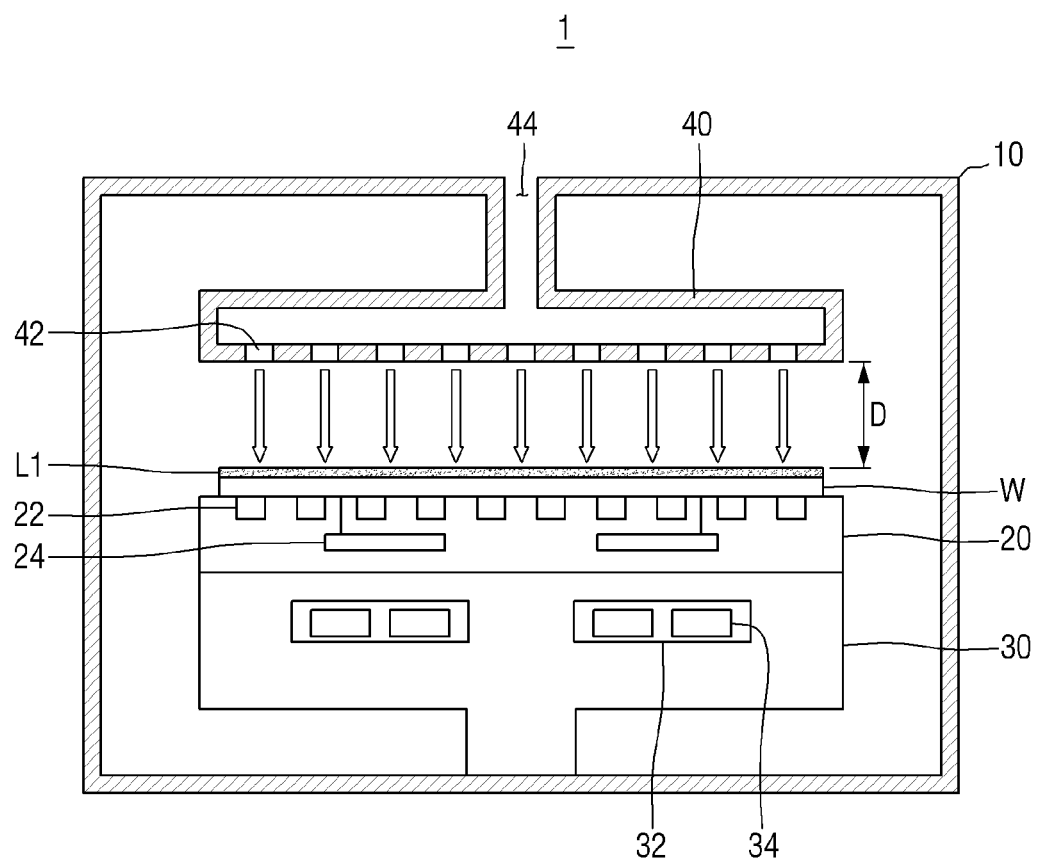
FIG. 4 is a cross-sectional view for reference in describing an operational example of the wafer processing apparatus of FIG. 1.

FIG. 4 is a cross-sectional view for reference in describing an operational example of the wafer processing apparatus of FIG. 1.

Referring to FIG. 4, first, the wafer processing apparatus 1 may cool the wafer W to a cryogenic temperature.

Specifically, the cooling plate 32 may cool the wafer W adhered to the electrostatic chuck 20 to a cryogenic temperature. The cooling channel 34 of the cooling plate 30 may receive the supply of cooling fluid from a cooler (e.g., a cooling pump) that may be located outside the chamber 10, and the cooling channel 34 may absorb heat from the wafer W through the electrostatic chuck 20.

Further, the coolant passage 22 of the electrostatic chuck 20 may also receive the supply of the cooling gas from a cooler (e.g., a cooling pump) that may be located outside the chamber 10, and the cooling gas flowing through the coolant passage 22 may also absorb heat from the wafer W.

The oxidizing gas injector 40 may then inject the oxidizing gas to the wafer W cooled to a cryogenic temperature through the aforementioned process. As a result, the metal layer formed on the wafer W may be oxidized to become the oxide layer L1.

In particular, the oxidizing gas injector 40 is disposed on the upper part of the wafer W and injects the oxidizing gas to a metal layer formed on the wafer W, and the distance D between the upper surface of the wafer W and the lower surface of the oxidizing gas injector 40 may be between 10 mm and 30 mm.

By forming the oxide layer L1 under a condition in which the wafer W is cooled to a cryogenic temperature, it is possible to minimize the penetration of oxygen into the free magnetic layer at the time of formation of the oxide layer. Also, in accordance with the above arrangement of the oxidizing gas injector 40, low chip distribution for the magnetic tunnel junction may be maintained to achieve uniform oxidation. Furthermore, since the cooling and oxidation are processed together in the chamber 10, there is no need to separately provide a cooling chamber and an oxidation chamber, and it is possible to save a space that may be occupied by the chambers.

In addition, oxidation at cryogenic temperatures results in improved surface roughness when compare to oxidation at non-cryogenic temperatures. Specifically, surface roughness of the oxide layer in the case of oxidation at non-cryogenic temperatures is in the range of 0.38 to 0.43 nm. On the other hand, average surface roughness of the oxide layer in the case of oxidation at cryogenic temperatures is in the range of 0.32 to 0.37 nm.

Figure 5:
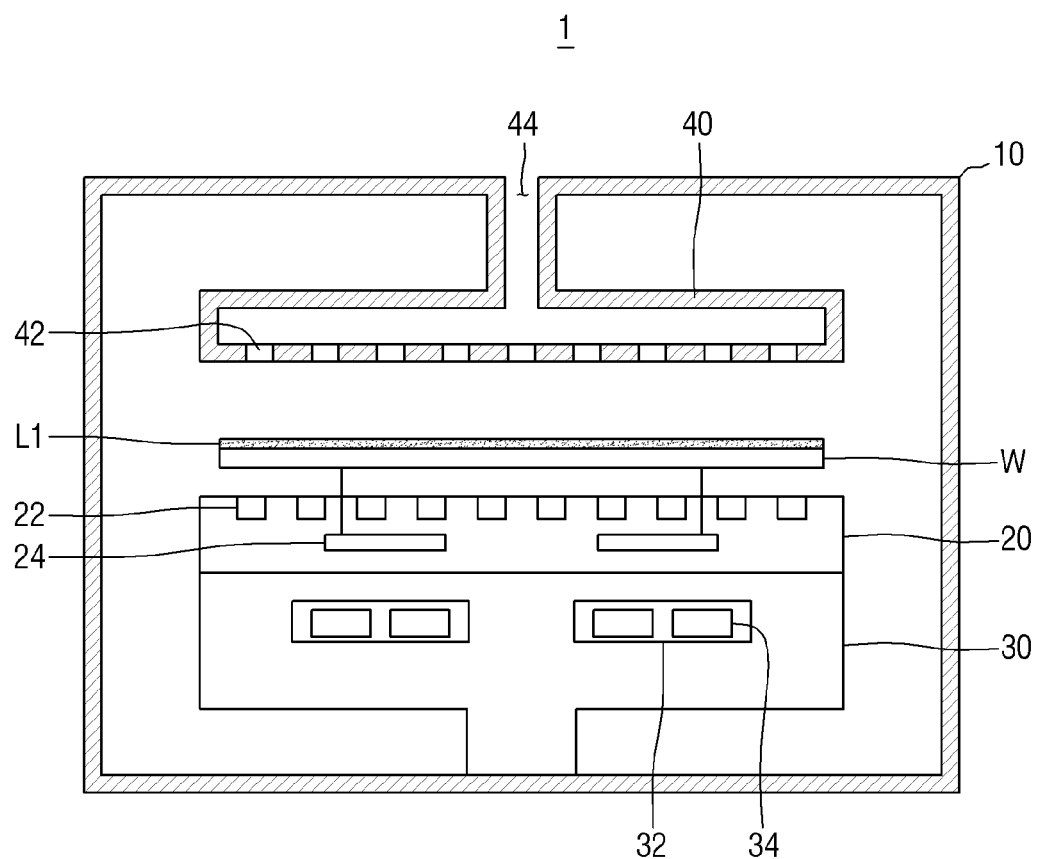
FIGS. 5 and 6 are cross-sectional views for reference in describing an operational example of the wafer processing apparatus of FIG. 1.
Figure 6:
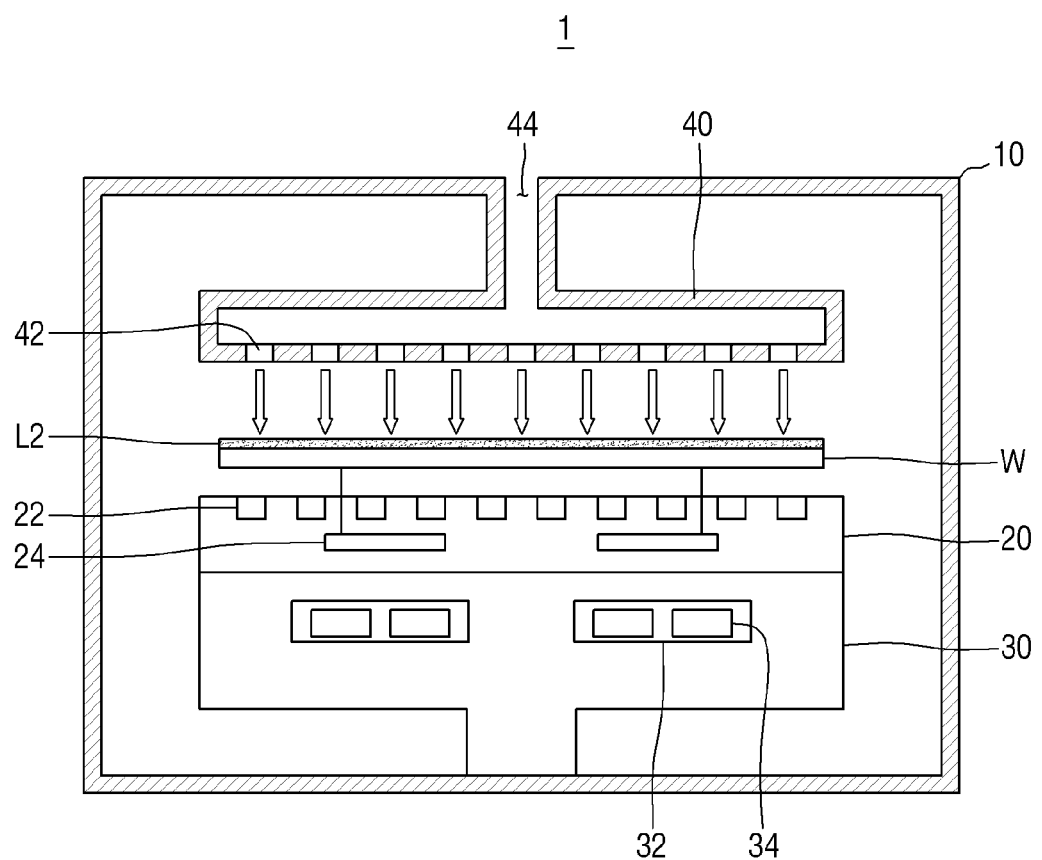

FIGS. 5 and 6 are cross-sectional views for reference in further describing an operational example of the wafer processing apparatus of FIG. 1. In this operational example, the formation of the oxide layer L1 as described in connection with FIG. 4 is considered a first oxidation. The processes associated with FIGS. 5 and 6 are considered a second oxidation which takes place after the first oxidation.

In particular, referring to FIG. 5, after the oxide layer L1 is formed, the lift pins 22 of the wafer processing apparatus 1 may lift the wafer W from the support surface of the electrostatic chuck 20. As a result, the temperature of the wafer W cooled at the first temperature may rise to a second temperature that is higher than the first temperature.

Next, referring to FIG. 6, the oxidizing gas injector 40 secondarily injects the oxidizing gas to the wafer W at the second temperature to additionally oxidize the oxide layer L1 and form an oxide layer L2.

In the case of this embodiment, as in the case of the preceding embodiment, the oxidizing gas injector 40 is disposed on the upper part of the wafer W to inject the oxidizing gas to the metal layer formed on the wafer W, and the distance D between the upper surface of the wafer W and the lower surface of the oxidizing gas injector 40 may be 10 mm to 30 mm, both in the first oxidation and the second oxidation.

Also in the case of this embodiment, the oxidation gas of the first oxidation is the same as the oxidation gas of the second oxidation. However, the embodiments of the disclosure are not limited in this fashion. For example, the oxidation gas of the first oxidation can differ from the oxidation gas of the second oxidation.

By switching from the cryogenic first oxidation to the non-cryogenic second oxidation, the overall processing time is reduced. This is because oxidation occurs more slowly at cryogenic temperatures. The previously described benefits of cryogenic oxidation can be realized by first oxidizing at cryogenic temperatures to obtain the oxide layer L1, and then later switching to a non-cryogenic process to speed up the overall oxidation process for obtaining the final oxide layer L2.

In an example embodiment, the first oxidation is carried out for 50 to 100 seconds, both inclusive, and the second oxidation is carried out for 70 to 120 seconds, both inclusive.

Also in an example embodiment, the cryogenic temperature of the first oxidation is equal to or less than 250° K. In another example embodiment, the cryogenic temperature of the first oxidation is equal to or less than 230° K. In another example embodiment, the cryogenic temperature of the first oxidation is equal to or less than 200° K.

In an example embodiment, the non-cryogenic temperature of the second oxidation process is greater than 250° K. In another example embodiment, the non-cryogenic temperature of the second oxidation process is equal to or greater than 270° K.

Figure 7:
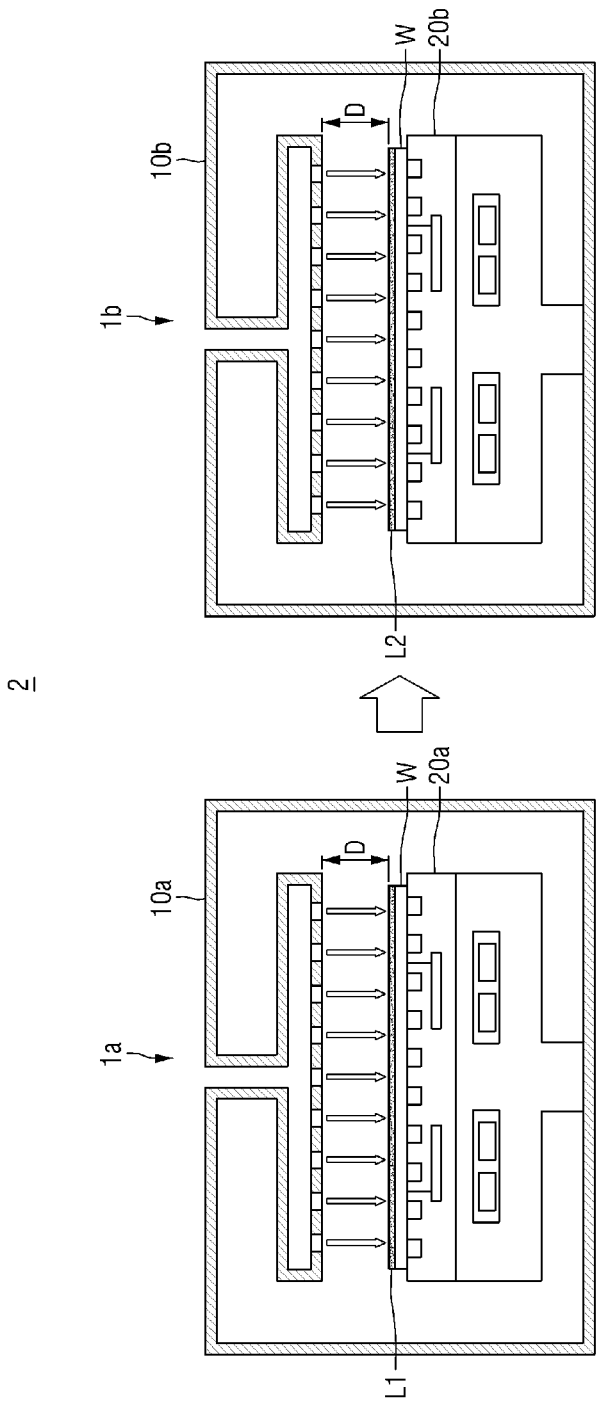
FIG. 7 is a cross-sectional view for reference in describing a wafer processing apparatus according to another embodiment of the present disclosure.

FIG. 7 is a cross-sectional view for reference in describing a wafer processing apparatus according to another embodiment of the present disclosure. In this example, the first and second oxidations described previously are carried out in separate chambers.

Referring to FIG. 7, a wafer processing apparatus 2 according to another embodiment of the present disclosure may include two chambers 10a and 10b. Each of the chambers 10a and 10b may correspond to independent wafer processing apparatus 1a and 1b.

The first chamber 10a may include a first electrostatic chuck 20a set so that the wafer W becomes a first temperature (i.e., a cryogenic temperature), and the second chamber 10b may include a second electrostatic chuck 20b set so that the wafer W becomes a second temperature that is higher than the first temperature. That is, when the wafer W is brought into close contact with the first electrostatic chuck 20a, it may be expected that the wafer W reaches the first temperature, and when the wafer W is brought into close contact with the second electrostatic chuck 20b, it may be expected that the wafer W reaches the second temperature.

First, the wafer W is fixed to the first electrostatic chuck 20a of the first chamber 10a. Then, after the wafer processing apparatus 1a cools the wafer W to the first temperature, the oxidizing gas injector therein may firstly inject the oxidizing gas to the wafer W of the first temperature. As a result, the metal layer formed on the wafer W may be oxidized to the oxide layer L1. That is, the wafer W having the first temperature by the first electrostatic chuck 20a in the first chamber 10a may be firstly oxidized in the first chamber 10a.

Next, the firstly oxidized wafer W is moved to the second chamber 10a and may be fixed to the second electrostatic chuck 20b of the second chamber 10b.

Then, after the wafer processing apparatus 1b raises the temperature of the wafer W to the second temperature, the oxidizing gas injector inside thereof may secondarily inject the oxidizing gas to the wafer W of the second temperature. As a result, the oxide layer L1 formed on the wafer W may be additionally oxidized to the oxide layer L2. That is, the wafer W having the second temperature by the second electrostatic chuck 20b in the second chamber 20a may be secondarily oxidized in the second chamber 20a.

In the case of this embodiment, as in the case of the previous embodiments, the oxidizing gas injector of the chambers 10a and 10b is disposed on the upper part of the wafer W to inject the oxidizing gas to the metal layer formed on the wafer W, and both in the first oxidation and second oxidation, the distance D between the upper surface of the wafer W and the lower surface of the oxidizing gas injector may be 10 mm to 30 mm.

Figure 8:
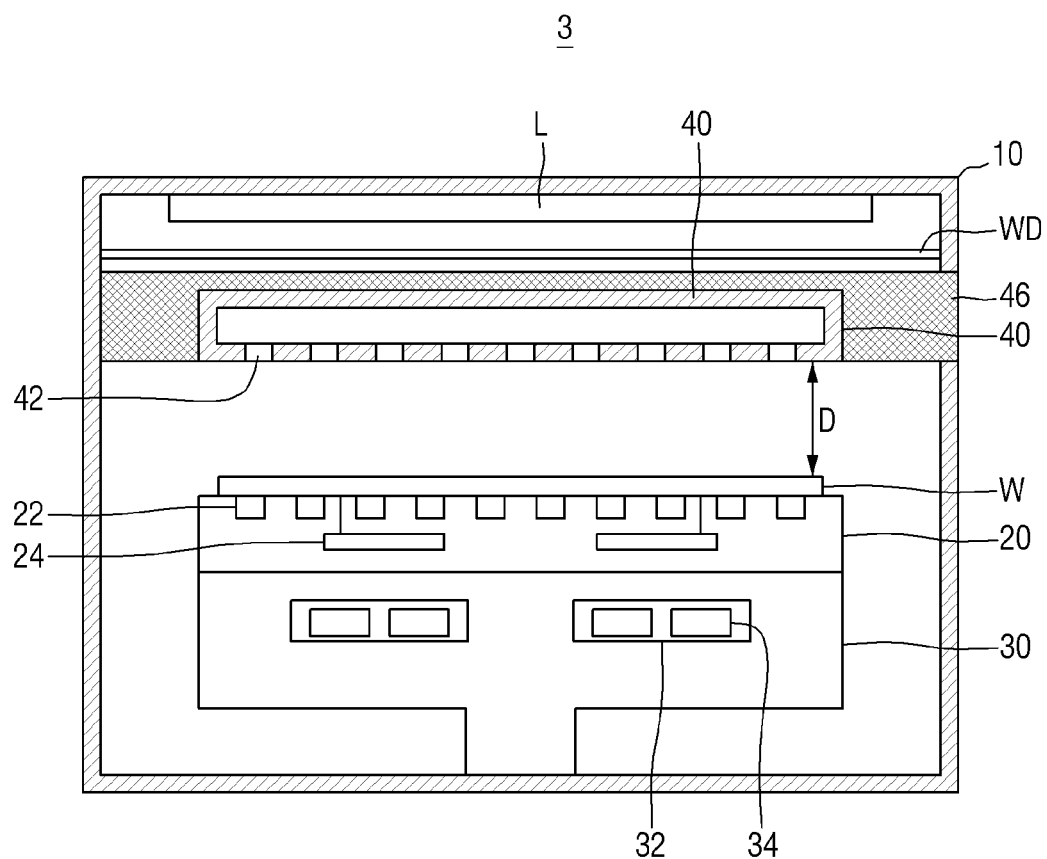
FIG. 8 is a cross-sectional view for reference in describing a wafer processing apparatus according to still another embodiment of the present disclosure.

FIG. 8 is a cross-sectional view for reference in describing a wafer processing apparatus according to still another embodiment of the present disclosure. The embodiment is at least partially characterized by the provision of a lamp L to heat the wafer W.

Referring to FIG. 8, a wafer processing apparatus 3 according to another embodiment of the present disclosure may further include a lamp L above the chamber 10.

The lamp L may emit light to heat the wafer W. For example, the lamp L may be provided as a flash lamp, a laser, or the like, and may perform an RTA (Rapid Thermal Anneal) process. As such, the wafer W may be heated to a desired temperature (for example, to the second temperature of the second oxidation) in a short period of time.

A window WD may be disposed below the lamp L. The window WD allows the light emitted from the lamp L to pass through so as to reach the wafer W, while isolating the lamp L from the oxidizing gas injected by the oxidizing gas injector 40.

In the present embodiment, although the configuration in which the lamp L is disposed inside the chamber 10 and the window WD is disposed between the lamp L and the gas injector 40 is illustrated, the scope of the present disclosure is not limited thereto. For example, unlike the configuration illustrated in FIG. 8, the lamp L may be disposed outside the chamber 10, and the window WD may be formed on the upper surface of the chamber 10.

On the other hand, the oxidizing gas injector 40 of the wafer processing apparatus 3 may be fixed in a moving device 46. That is, as illustrated, the moving device 46 contains the oxidizing gas injector 40 and may be disposed so as to be movable between the lamp L and the wafer W.

Specifically, while the oxidizing gas injector 40 injects the oxidizing gas, the moving device 46 may move to a position between the lamp L and the wafer W. On the other hand, while the lamp L emits light, the moving device 46 moves, for example, to the outside of the chamber 10 to avoiding blocking the light emitted from the lamp L from reaching the wafer W.

Figure 9:
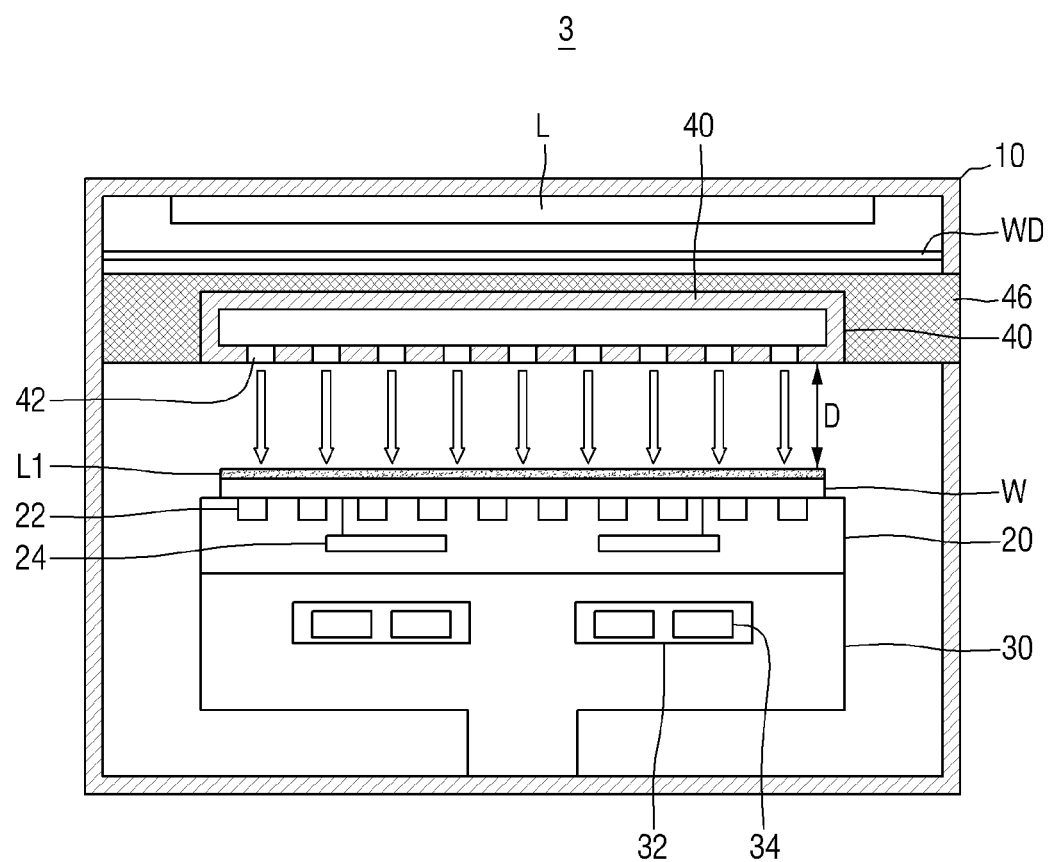
FIGS. 9 and 10 are cross-sectional views for reference in describing an operational example of the wafer processing apparatus of FIG. 8.
Figure 10:
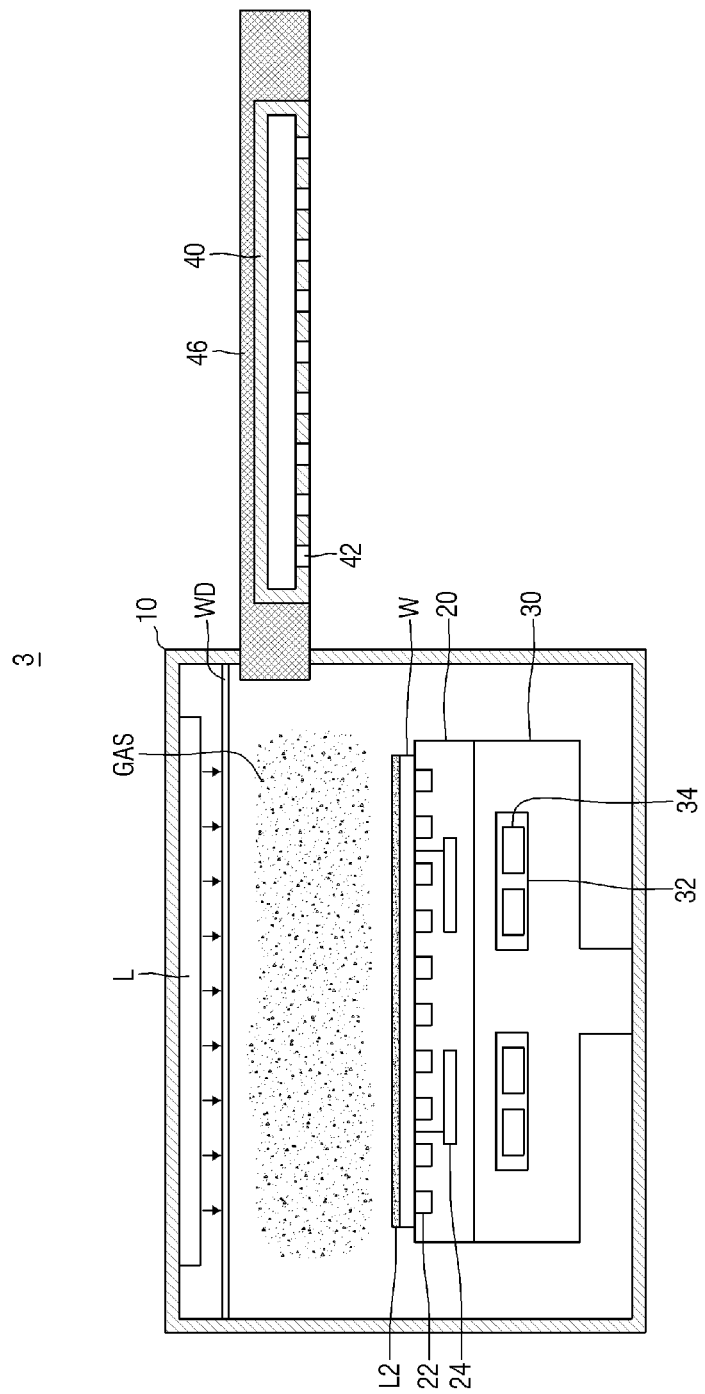

FIGS. 9 and 10 are cross-sectional views for reference in describing an operational example of the wafer processing apparatus of FIG. 8.

First, referring to FIG. 9, after the wafer processing apparatus 3 first cools the wafer W to the first temperature (i.e., cryogenic temperature), the oxidizing gas injector 40 may firstly inject the oxidizing gas to the wafer W of the first temperature. As a result, the metal layer formed on the wafer W may be oxidized to the oxide layer L1.

Referring now to FIG. 10, after the oxide layer L1 is formed, the moving device 46 may move, for example, to the outside of the chamber 10 to avoid blocking the passage of light between the lamp L and the wafer W. Thereafter, the lamp L emits light to the wafer W to which the oxidizing gas has been injected, and causes the upper part of the oxide layer L1 to react with the light to form the oxide layer L2. That is, while the lamp L emits light, the oxidizing gas injector 40 may stop the injection of the oxidizing gas.

When the lamp L emits light to the wafer W, the temperature of the wafer W will rise to the second temperature that is higher than the first temperature, and since already injected oxidizing gas remains in the chamber 10, the oxide layer L2 is formed by additionally oxidizing the oxide layer L1 with respect to the wafer W at the second temperature.

In the case of this embodiment, as in the case of the aforementioned embodiment, the oxidizing gas injector 40 is disposed on the upper part of the wafer W to inject the oxidizing gas to the metal layer formed on the wafer W, and the distance D between the upper surface of the wafer W and the lower surface of the oxidizing gas injector 40 may be 10 mm to 30 mm.

Figure 11:
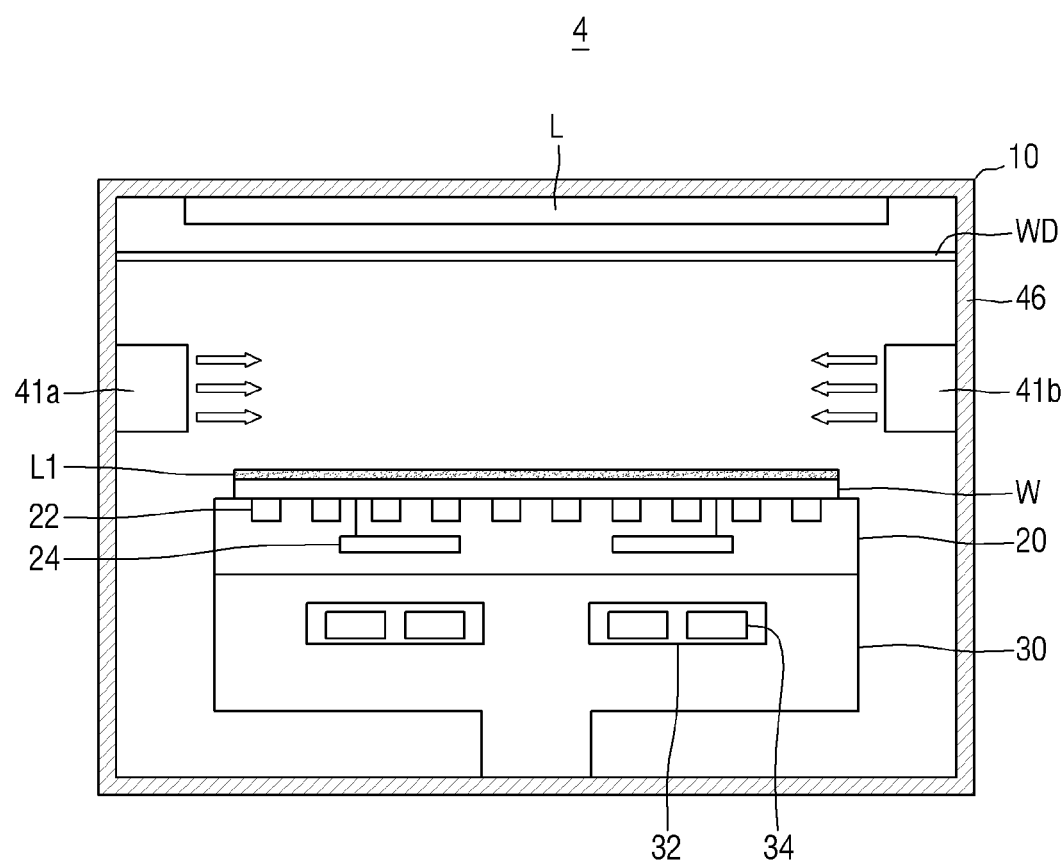
FIG. 11 is a cross-sectional view for reference in describing a wafer processing apparatus according to another embodiment of the present disclosure.
Figure 12:
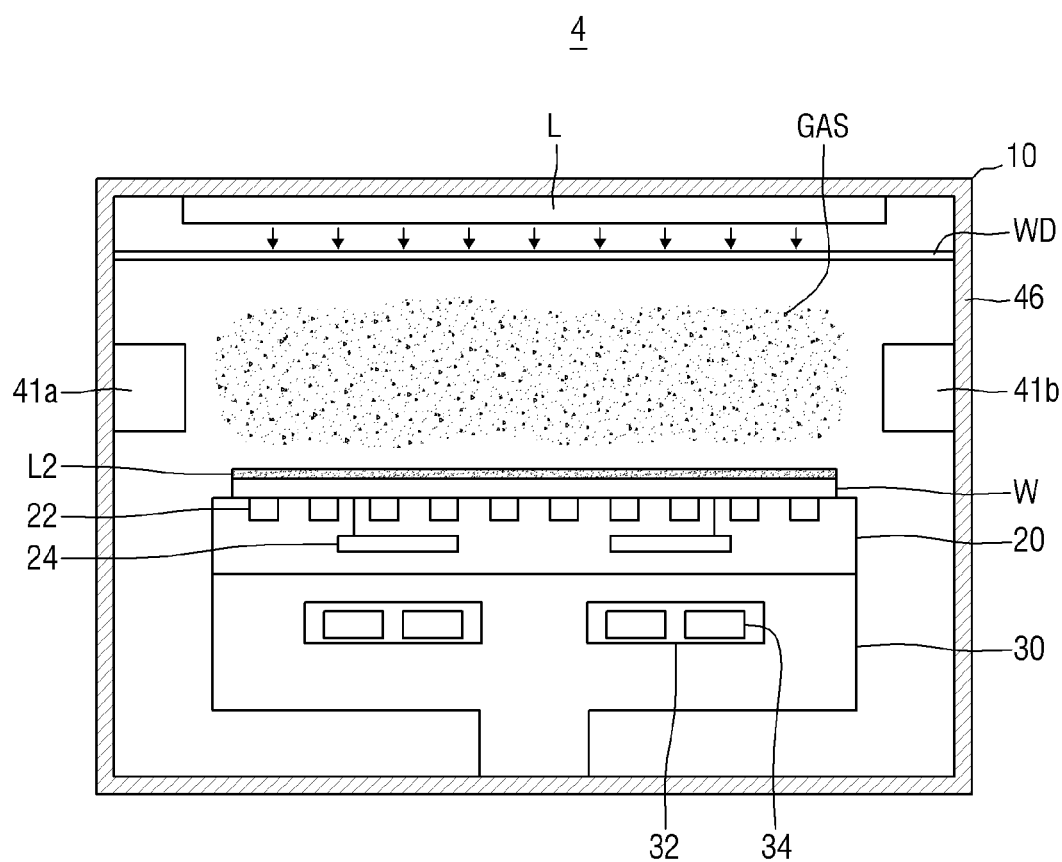
FIG. 12 is a cross-sectional view for reference in describing an operational example of the wafer processing apparatus of FIG. 11.

FIG. 11 is a cross-sectional view for reference in describing a wafer processing apparatus according to still another embodiment of the present disclosure. FIG. 12 is a cross-sectional view for reference in describing an operational example of the wafer processing apparatus of FIG. 11. The example of this embodiment is characterized by locating the gas injector at a side surface of the chamber.

Referring to FIG. 11, unlike the previous embodiments, the oxidizing gas injectors 41a and 41b may be disposed to be adjacent to at least one side surface of the chamber. That is, in the wafer processing apparatus 4, the oxidizing gas injectors 41a and 41b may be disposed to be adjacent to at least one side surface of the chamber so as not to hinder the light emission of the lamp L to the wafer W.

Referring to FIG. 11, after the wafer processing apparatus 4 first cools the wafer W to the first temperature, the oxidizing gas injectors 41a and 41b may firstly inject the oxidizing gas to the wafer W of the first temperature. Accordingly, the metal layer formed on the wafer W may be oxidized to the oxide layer L1.

Referring now to FIG. 12, after the oxide layer L1 is formed, the lamp L emits light to the wafer W onto which the oxidizing gas is injected, and causes the upper part of the oxide layer L1 to react with light to form an oxide layer L2. In this case, while the lamp L emits light, the oxidizing gas injectors 41a and 41b may stop the injection of the oxidizing gas.

When the lamp L emits light to the wafer W, the temperature of the wafer W rises to a second temperature that is higher than the first temperature, and since already injected oxidizing gas remains in the chamber 10, the oxide layer L2 is formed by additionally oxidizing the oxide layer L1 with respect to the wafer W of the second temperature.

Also in the case of this embodiment, the oxidizing gas injector 40 is arranged on the upper part of the wafer W in the same way as in the case of the aforementioned embodiments.

Figure 13:
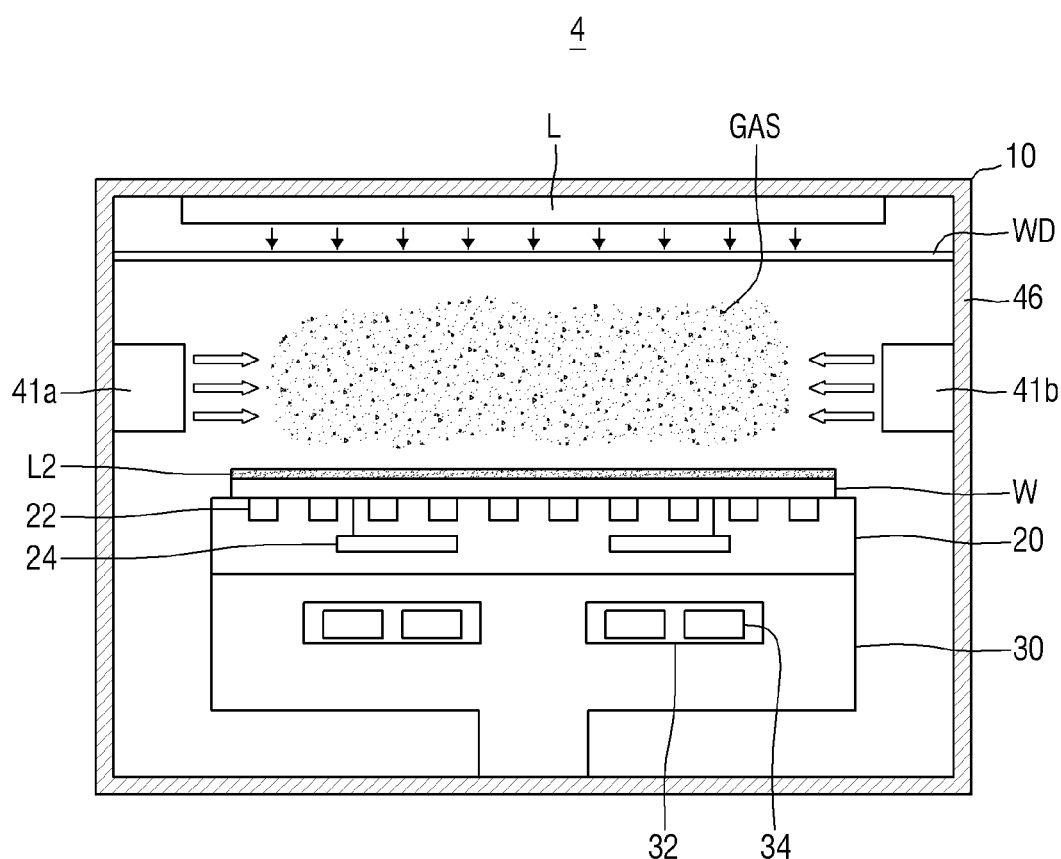
FIG. 13 is a cross-sectional view for reference in describing an operational example of the wafer processing apparatus of FIG. 11.

FIG. 13 is a cross-sectional view for reference in describing another operational example of the wafer processing apparatus of FIG. 11.

Referring to FIG. 13, unlike the case of FIG. 12, while the lamp L emits light, the oxidizing gas injectors 41a and 41b may continue to inject the oxidizing gas. That is, after the oxide layer L1 is formed, while the lamp L emits light to the wafer W to which the oxidizing gas is injected, and causes the upper part of the oxide layer L1 to react with the light to form the oxide layer L2, the oxidizing gas injectors 41a and 41b may also continue the injection of the oxidizing gas. As a result, more sufficient oxidation may be achieved.

FIGS. 14 to 17 are cross-sectional views for reference in describing a method of manufacturing a memory device according to an embodiment of the present disclosure.

Figure 14:
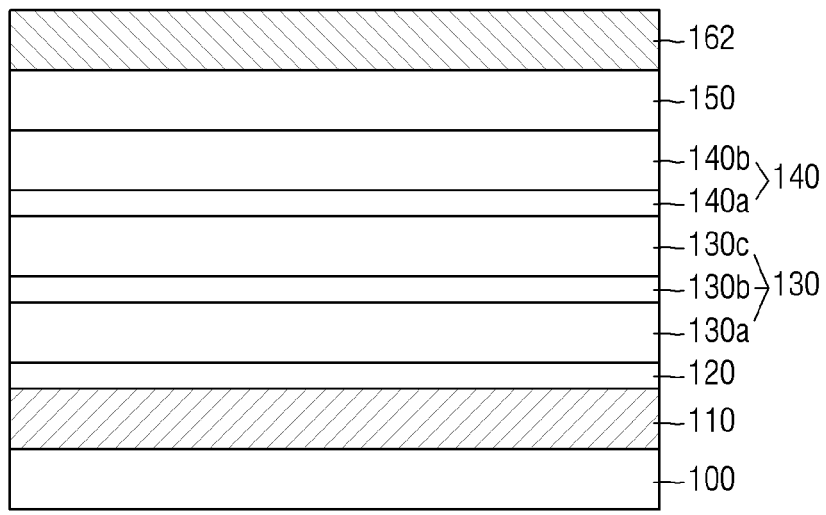
FIGS. 14 to 17 are cross-sectional views reference in describing a method for manufacturing a memory device according to an embodiment of the present disclosure.

Referring to FIG. 14, in a method for manufacturing a memory device 5 according to an embodiment of the present disclosure, a lower electrode layer 110 is formed over a substrate 100. Further, a seed layer 120, a fixed magnetic layer structure 130, a tunnel barrier structure 140 and a free magnetic layer 150 are sequentially formed over the lower electrode layer 110. Thereafter, a metal layer 162 is formed over the free magnetic layer 150.

The substrate 100 may include a semiconductor material such as silicon, germanium and silicon-germanium, or a group III-V compound semiconductor such as GaP, GaAs and GaSb. In some embodiments of the present disclosure, the substrate 100 may be an SOI (Silicon-On-Insulator) substrate or a GOI (Germanium-On-Insulator: GOI) substrate.

Various devices such as a word line, a transistor, a diode, a source/drain layer, a source line, a contact plug, a via, a wiring, and the like, and an interlayer insulating layer for covering them may be formed on the substrate 100.

The lower electrode layer 110 may be formed to include a metal and/or a metal nitride. For example, the lower electrode layer 110 may include a metal such as tungsten, titanium, and tantalum, and/or a metal nitride such as tungsten nitride, titanium nitride and tantalum nitride.

The seed layer 120 may serve as a seed for growth of a first fixed magnetic layer 130a of the fixed magnetic layer structure 130 having a desired crystal orientation. The seed layer 120 may, as examples, contain one or more metals such as ruthenium (Ru), rhenium (Re), iridium (Ir), rhodium (Rh), hafnium (Hf) and tantalum (Ta).

The fixed magnetic layer structure 130 may be a multilayer structure including plural fixed magnetic sublayers. For example, in the example of FIG. 14, the fixed magnetic layer structure 130 may include the first fixed magnetic layer 130a, a spacer layer 130b and a second fixed magnetic layer 130c. However, embodiments of the present disclosure are not limited in this fashion. For example, the fixed magnetic layer structure 130 may instead be formed to include only a single fixed magnetic layer.

The first fixed magnetic layer 130a may include a ferromagnetic material such as cobalt (Co), platinum (Pt), iron (Fe) and/or nickel (Ni). In some embodiments of the present disclosure, the first fixed magnetic layer 130a includes an alloy (CoPt) of cobalt and platinum, or may have a composite layer pattern structure in which a cobalt layer pattern and a platinum layer pattern are alternately laminated.

The spacer layer 130b may include a synthetic antiferromagnetic (SAF) material. Accordingly, the spacer layer 130b may function as an antiferromagnetic coupling spacer. The spacer layer 130b may be formed to include, for example, at least one of ruthenium (Ru), iridium (Ir) or rhodium (Rh).

The second fixed magnetic layer 130c may include, for example, a cobalt-iron (CoFe)-based material, such as a composite material of CoFe, NiFe, FeCr, CoFeNi, PtCr, CoCrPt, CoFeB, NiFeSiB and/or CoFeSiB.

The tunnel barrier structure 140 may include a metal oxide having insulating properties. For example, the tunnel barrier structure 140 may include magnesium oxide, aluminum oxide, and the like.

The tunnel barrier structure 140 of FIG. 14 is represented as including a plurality (two or more) of tunnel barrier layers 140a and 140b. However, the embodiments of the present disclosure are not limited in this fashion. For example, the tunnel barrier structure 140 may be formed to include only a single barrier layer.

The free magnetic layer 150 may include ferromagnetic materials such as cobalt (Co), platinum (Pt), iron (Fe) and nickel (Ni). The free magnetic layer 150 may further include boron (B) or silicon (Si). These elements may be used alone or in combination of two or more. For example, the free magnetic layer 150 may include a composite material such as CoFe, NiFe, FeCr, CoFeNi, PtCr, CoCrPt, CoFeB, NiFeSiB, and CoFeSiB.

In the embodiment of FIG. 14, the free magnetic layer 150 is located over the tunnel barrier structure 140. In some other embodiments of the disclosure, the free magnetic layer 15 may also be disposed below the fixed magnetic layer structure 130.

The metal layer 162 may include, for example, tantalum, zirconium, titanium, vanadium, yttrium, scandium, molybdenum, magnesium, cobalt and the like.

Figure 15:
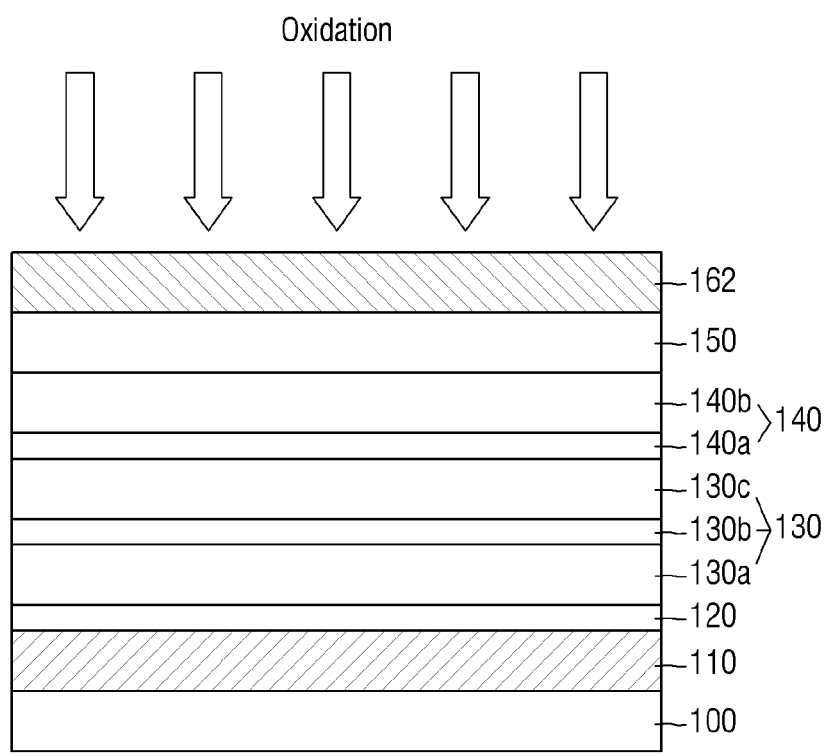

Referring to FIG. 15, the metal layer 162 may be oxidized using the above-described wafer processing apparatuses 1, 2, 3 and 4. That is, an oxide layer 160 (FIG. 17) may be formed by oxidizing the metal layer 162 formed on the free magnetic layer 150, using the wafer processing apparatuses 1, 2, 3 and 4 as described previously. The oxidation may take place at a cryogenic temperature as described previously. Alternately, the oxidation may include a first oxidation at a cryogenic temperature, followed by a second oxidation at a non-cryogenic temperature as described previously As an example, in order to oxidize the metal layer 162, the metal layer 162 is cooled at a first temperature by utilizing the electrostatic chuck 20 cooled by the cooling plate 32, and the oxidizing gas may be injected to the metal layer 162, by utilizing the oxidizing gas injector 40 disposed on the upper part of the metal layer 100.

As another example, the oxidizing gas is firstly injected to the metal layer 162 of the first temperature, the substrate 100 is raised from the electrostatic chuck 20 using the lift pins 22 to raise the temperature of the metal layer 162 to the second temperature that is higher than the first temperature, and the oxidizing gas may be secondarily injected to the metal layer 162 of the second temperature.

As still another example, after the oxidizing gas is injected to the metal layer 162, the substrate 100 is moved to another chamber, the temperature of the metal layer 162 is raised to the second temperature that is higher than the first temperature in another chamber, and the oxidizing gas may be additionally injected to the metal layer 162 of the second temperature in another chamber.

As another example, after the oxidizing gas is injected to the metal layer 162, light may be emitted to the metal layer 162 using the lamp L in order to heat the metal layer 162. While emitting the light to the metal layer 162 using the lamp L, the oxidizing gas injector 40 may stop or continue the injection of the oxidizing gas.

In the aforementioned embodiments, the oxidizing gas injector 40 is disposed on the upper part of the substrate 100, and the distance between the upper surface of the metal layer 162 and the lower surface of the oxidizing gas injector 40 may be 10 mm to 30 mm.

Figure 16:
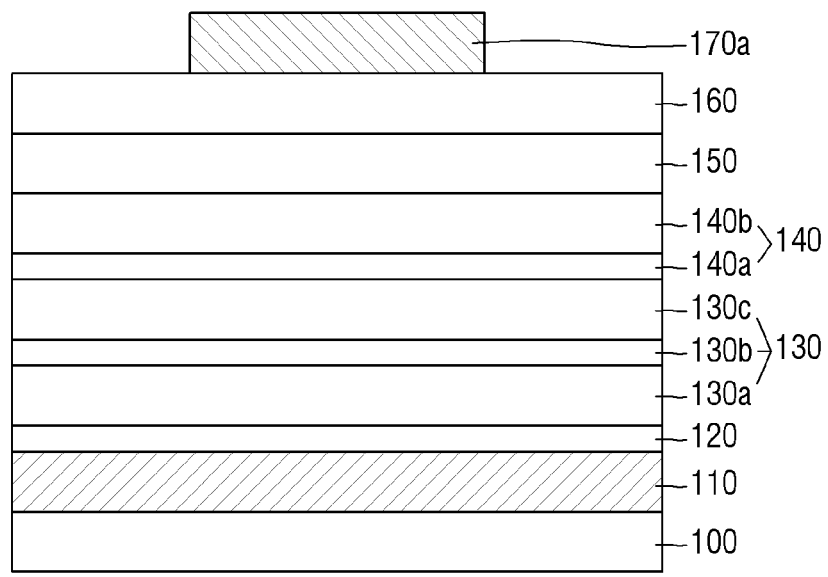

Subsequently, referring to FIG. 16, an oxide layer 160 may be formed by oxidizing the metal layer 162 using the methods described in FIG. 15.

Figure 17:
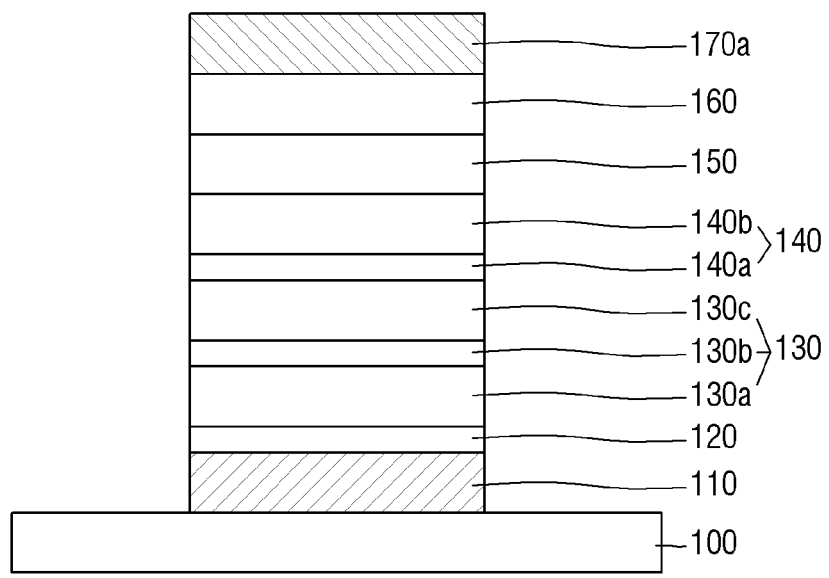

Subsequently, referring to FIG. 17, an upper electrode 170a may be formed on the oxide layer 160. The upper electrode 170a may be formed by forming the upper electrode layer 170 on the metal layer 162 and then patterning the upper electrode layer 170.

Like the lower electrode layer 110, the upper electrode layer 170 may be formed to include a metal or a metal nitride. For example, the upper electrode layer 170 may include a metal such as tungsten, titanium and tantalum or a metal nitride such as tungsten nitride, titanium nitride and tantalum nitride.

Next, referring to FIG. 18, by performing an etching process in which the upper electrode 170a is used as an etching mask, the oxide layer 160, the free magnetic layer 150, the tunnel barrier structure 140, the fixed magnetic layer structure 130, the seed layer 120 and the lower electrode layer 110 below the upper electrode 170a may be etched. In some embodiments of the present disclosure, the etching process may be, for example, a dry etching process including an ion beam etching (IBE) process or a sputtering process. The structure formed in this manner may form the memory device 6 as explained below in connection with FIGS. 18 to 22.

FIGS. 18 to 22 are cross-sectional views for reference in describing a method for manufacturing a memory device according to an embodiment of the present disclosure.

Figure 18:
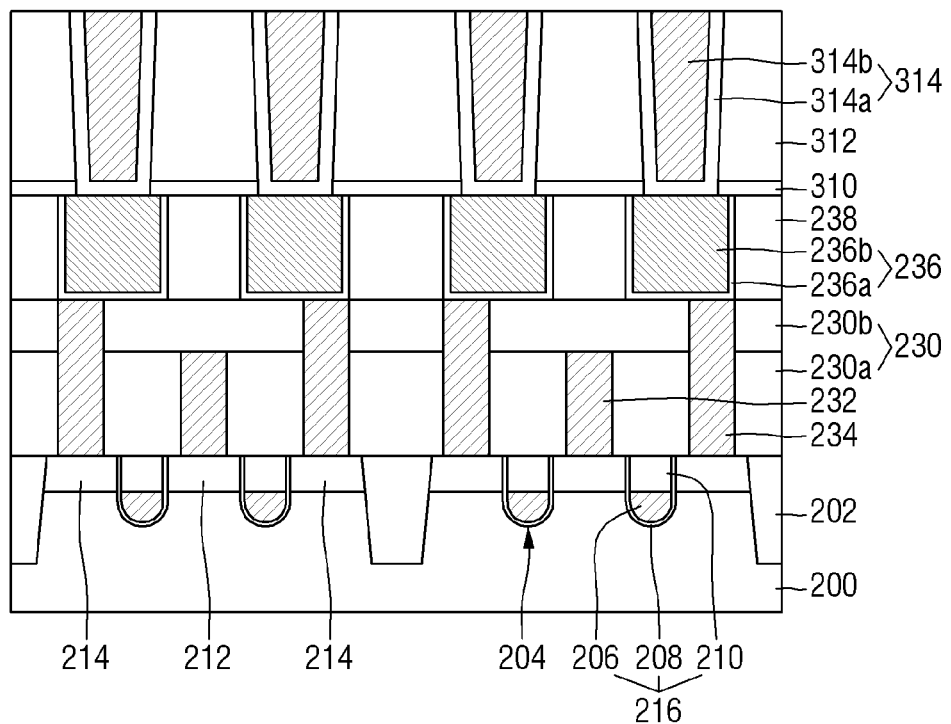
FIGS. 18 to 22 are cross-sectional views reference in describing the method for manufacturing the memory device according to an embodiment of the present disclosure.

Referring to FIG. 18, in the method for manufacturing the memory device 6 according to an embodiment of the present disclosure, an element isolation layer 202 is first formed on a substrate 200 to divide the substrate 200 into an active region and a field region, and a transistor 216 is formed on the substrate 200 in the active region.

Specifically, a line-shaped trench 204 extending in a first direction is formed on the substrate 200, and a gate including a gate insulating layer pattern 208, a gate electrode 206 and a hard mask pattern 210 is formed in the trench 204. Further, impurities may be implanted into the active regions on both sides of the gate to form the source region 212 and the drain region 214, respectively.

Next, in the above method, a first lower interlayer insulating layer 230a is formed on the substrate 200. A part of the first lower interlayer insulating layer 230 is etched to form opening portions for exposing the surface of the source region 212, and a first conductive layer is formed inside the opening and planarized to form a source line 232 which is in contact with the source region 212. Further, a second lower interlayer insulating layer 230b is formed on the first lower interlayer insulating layer 230a and the source line 232. Therefore, the lower interlayer insulating layer 230 including the first and second lower interlayer insulating layers 230a and 230b is formed.

Next, opening portions for exposing the drain region 214 are formed through the lower interlayer insulating layer 230, a second conductive layer is formed inside the opening portions and is planarized to form a contact plug 234 which is in contact with the contact plug 214.

Next, a first interlayer insulating layer 238 is formed on the lower interlayer insulating layer 230, and a first wiring structure 234, which penetrates the first interlayer insulating layer 238 to come into contact with the contact plug 236, is formed. The first wiring structure 236 may include a barrier layer 236a and a metal pattern 236b.

Next, an etching stop layer 310, a second interlayer insulating layer 312 and a lower electrode contact 314 are formed on the first wiring structure 236 and the first interlayer insulating layer 238. Further, a part of the second interlayer insulating layer 312 and the etching stop layer 310 is etched to form a first contact hole for exposing the upper surface of the first wiring structure 236. A first barrier layer and a first conductive layer are formed inside the first contact hole. Further, the first conductive layer and the first barrier layer are planarized so that the upper surface of the second interlayer insulating layer 312 is exposed, thereby forming a lower electrode contact 314 including a barrier pattern 314a and a conductive pattern 314b.

Figure 19:
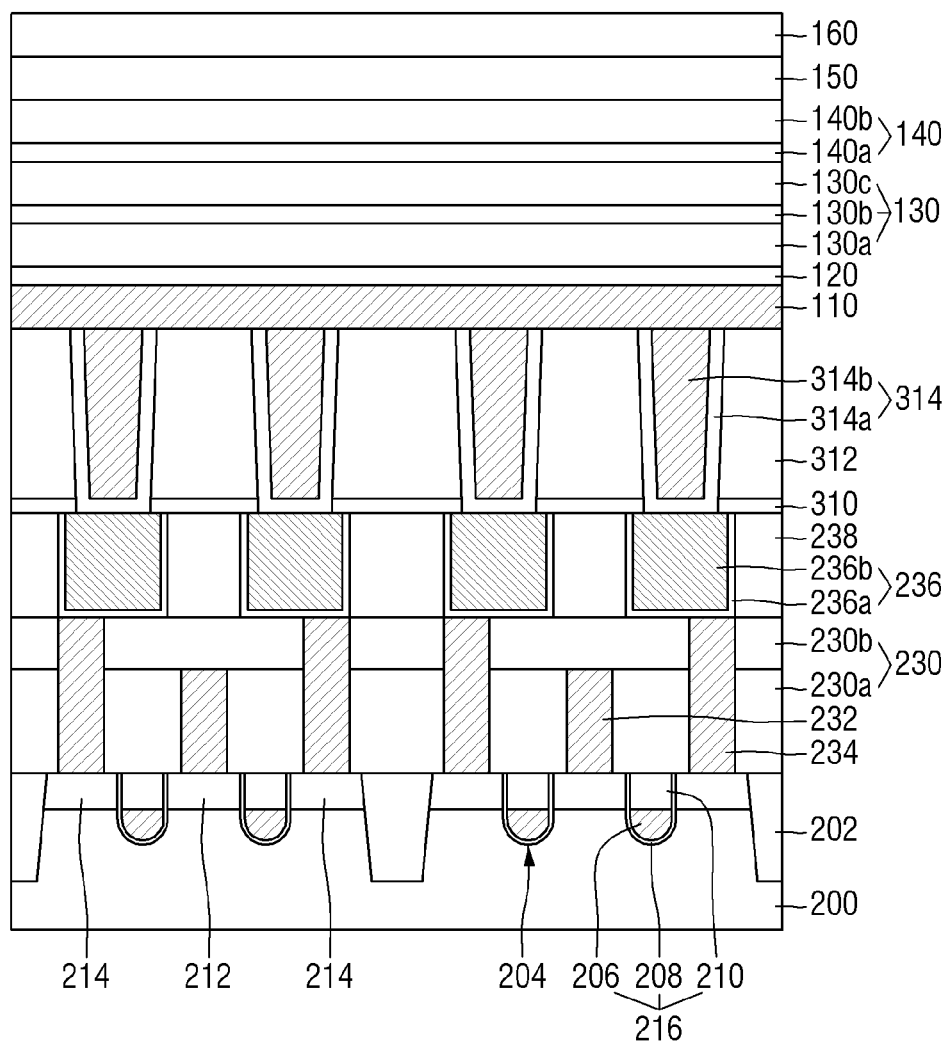

Next, referring to FIG. 19, as described with reference to FIG. 14, a lower electrode layer 110 is formed on the lower electrode contact 314 and the second interlayer insulating layer 312. Further, a seed layer 120, a fixed magnetic layer structure 130, a tunnel barrier structure 140, a free magnetic layer 150 and an oxide layer 160 are formed on the lower electrode layer 110.

Here, as described with reference to FIG. 15, the oxide layer 160 may be formed by oxidizing the metal layer 162 formed on the free magnetic layer 150, using the wafer processing apparatuses 1, 2, 3 and 4 as described previously. The oxidation may take place at a cryogenic temperature as described previously. Alternately, the oxidation may include a first oxidation at a cryogenic temperature, followed by a second oxidation at a non-cryogenic temperature as described previously.

Figure 20:
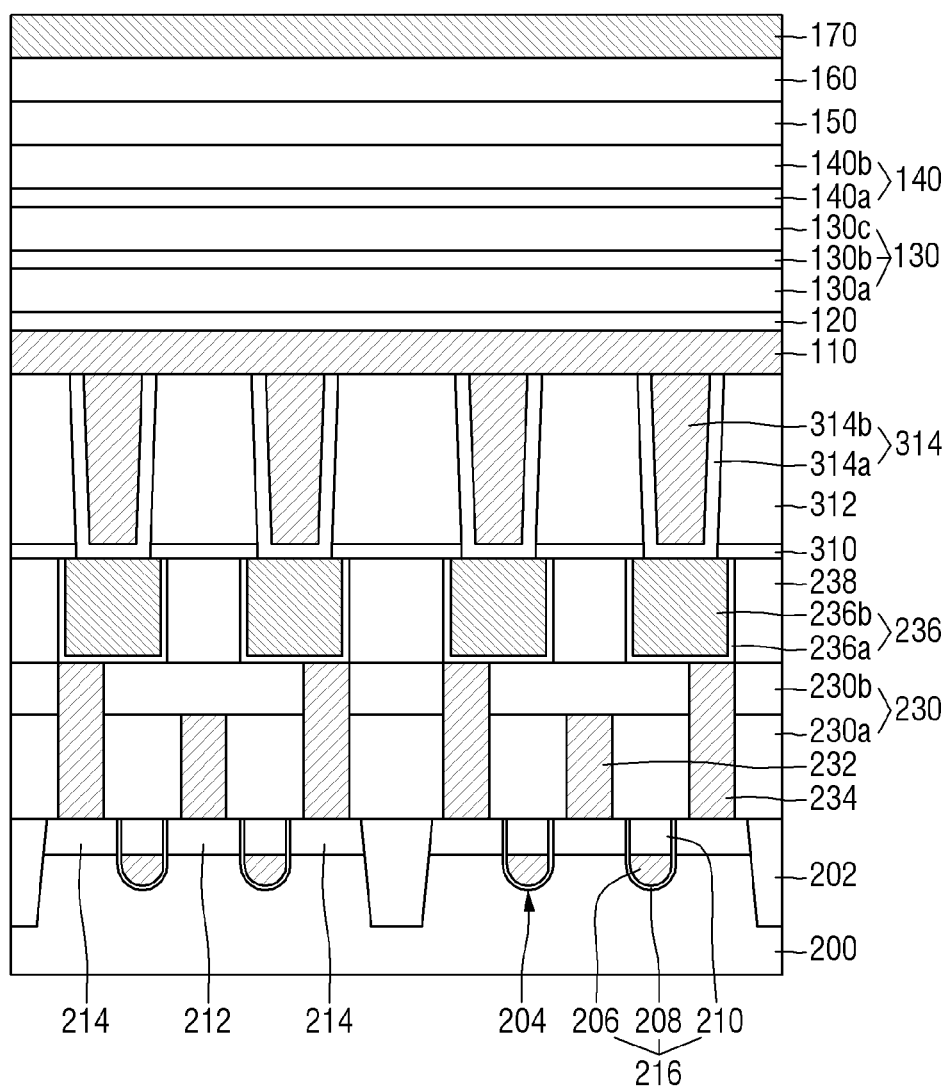

Next, referring to FIG. 20, as described with reference to FIG. 17, an upper electrode layer 170 may be formed on the oxide layer 160.

Figure 21:
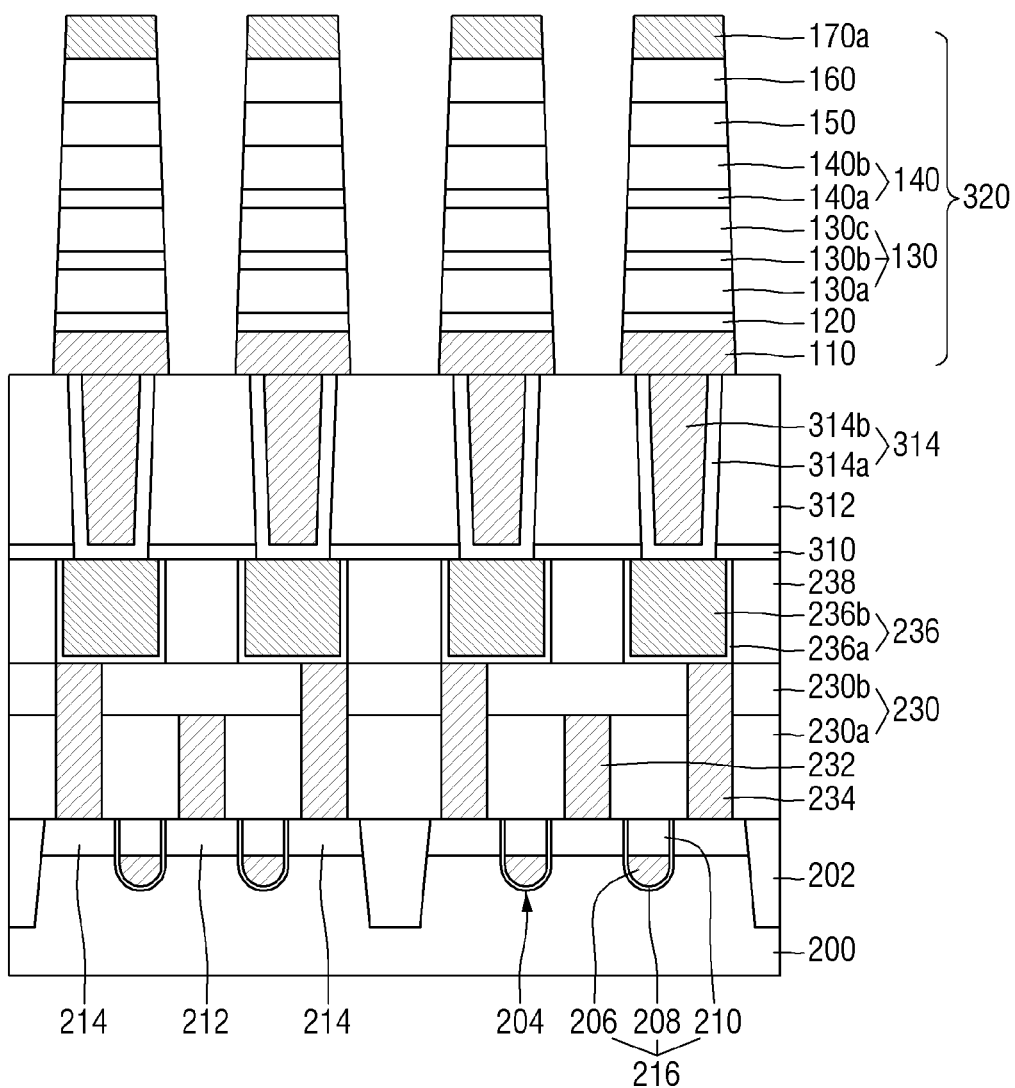

Next, referring to FIG. 21, as described with reference to FIG. 18, the upper electrode layer 170 is patterned to form the upper electrode 170a. The upper electrode 170a may overlap the upper surface of the lower electrode contact 314. Thereafter, by utilizing the upper electrode 170a as an etching mask, the oxide layer 160, the free magnetic layer 150, the tunnel barrier structure 140, the fixed magnetic layer structure 130, the seed layer 120 and the lower electrode layer 110 of the lower part of the upper electrode 170a are etched. Therefore, a variable resistor structure 320 may be formed.

Figure 22:
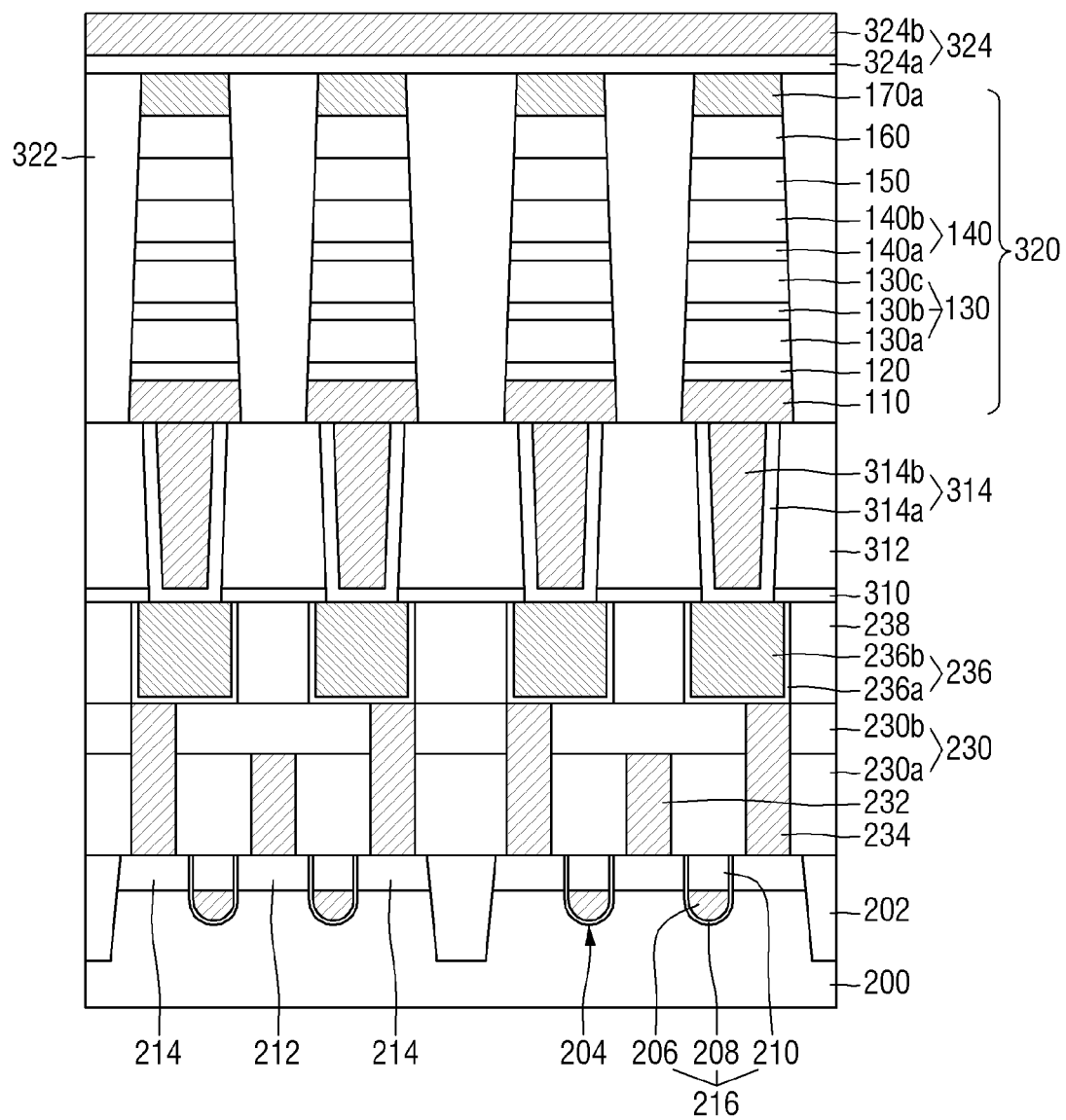

Next, referring to FIG. 22, a third interlayer insulating layer 322 for covering the variable resistor structure 320, while filling the gap between the variable resistance structure 320 is formed on the second interlayer insulating layer 312.

A bit line 324 which penetrates the third interlayer insulating layer 322 to make contact with the upper surface of the variable resistance structure 320 is formed. The bit line 324 may extend in a second direction perpendicular to the first direction in which the trench 204 extends, while being in contact with the upper electrode 170a. Further, a plurality of bit lines 324 may be formed to be parallel to each other.

The bit line 324 may have a structure in which a barrier pattern 324a and a metal pattern 324b are stacked. The barrier pattern 324a may include titanium, titanium nitride, tantalum, tantalum nitride, or the like. The metal pattern 324b may include copper, tungsten, aluminum, or the like. Thereafter, an upper interlayer insulating layer for covering the third interlayer insulating layer 322 and the bit line 324 may be further formed.

By performing such a process, a magnetoresistive memory device including the transistor 216, the lower electrode contact 314 and the variable resistance structure 320 on the substrate 200 may be formed.

Figure 23:
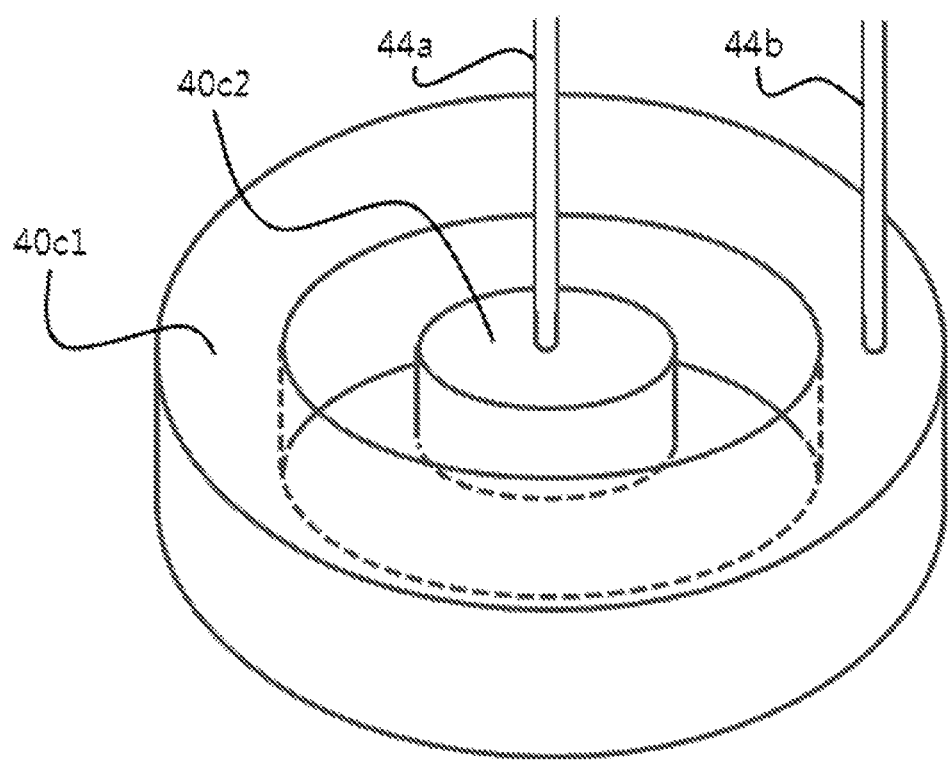
FIG. 23 is a diagram for reference in describing another example of an oxidizing gas injector which may be used for the wafer processing apparatus of FIG. 1.

FIG. 23 illustrates another embodiment of the gas injector 42 of FIG. 1. In this example, the gas injector is a shower head type gas injector having a peripheral portion 40c1 that surrounds a central portion 40c2. The peripheral portion 40c1 and the central portion 40c2 are coupled to separate gas feeds 44b and 44a, respectively, to allow for the injection of gas to wafer W to independently controllable. For example, a gas pressure of the peripheral portion 40c1 may be controlled to differ from that of the central portion 40c2. In this manner, the control characteristics of the oxidation of the metal layer of the wafer W may be enhanced.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A method of manufacturing a magnetic-tunnel-junction (MTJ) device, the method comprising:
    forming a free magnetic layer over a substrate;
    forming a metal layer over the free magnetic layer;
    oxidizing the metal layer by exposing the metal layer to a first oxidation gas at a first temperature of 250° K or less; and
    further exposing the metal layer to a second oxidation gas at a second temperature that is higher than the first temperature.

2. The method of claim 1, wherein at least one of the first and second oxidation gases is supplied from a shower head located at a distance between 10 and 30 mm, both inclusive, over a surface of the metal layer.

3. The method of claim 1, wherein both of the first and second oxidation gases are supplied from a shower head located at a distance between 10 and 30 mm, both inclusive, over a surface of the metal layer.

4. The method of claim 1, wherein the first temperature is equal to or less than 230° K.

5. The method of claim 1, wherein the first temperature is equal to or less than 200° K.

6. The method of claim 1, wherein the second temperature is equal to or greater than 270° K.

7. The method of claim 1, wherein the metal layer is exposed to the first oxidation gas at the first temperature for 50 to 100 seconds, both inclusive, and the metal layer is exposed to the second oxidation gas at the second temperature for 70 to 120 seconds, both inclusive.

8. The method of claim 1, wherein the first oxidation gas and the second oxidation gas a same oxidation gas.

9. The method of claim 8, wherein the metal layer is continuously exposed to the same oxidation gas as a temperature of the substrate transitions from the first temperature to the second temperature.

10. The method of claim 8, wherein exposing the metal layer to the first oxidation gas at the first temperature is carried out in a same chamber as exposing the metal layer to the second oxidation gas at the second temperature.

11. The method of claim 1, further comprising:
    placing a wafer containing the MTJ device on an electrostatic chuck, the electromagnetic chuck in thermal contact with a cooling plate located below the electrostatic chuck; and
    cooling the electrostatic chuck using the cooling plate so as to cool the wafer to the first temperature.

12. The method of claim 1, further comprising:
    placing a wafer containing the MTJ device on an electrostatic chuck, the electromagnetic chuck in thermal contact with a cooling plate located below the electrostatic chuck;
    cooling the electrostatic chuck using the cooling plate so as to cool the wafer to the first temperature; and
    raising a temperature of the wafer to the second temperature.

13. The method of claim 12, wherein raising the temperature of the wafer to the second temperature comprises lifting the wafer off a support surface of the electrostatic chuck.

14. The method of claim 12, wherein raising the temperature of the wafer to the second temperature comprises using a lamp to heat the wafer.

15. The method of claim 1, further comprising:
    forming a lower electrode over the substrate;
    forming a fixed magnetic layer over the lower electrode;
    forming a tunnel barrier layer over the fixed magnetic layer,
    wherein the free magnetic layer is formed over the tunnel barrier layer.

16. The method of claim 15, wherein the fixed magnetic layer is formed from a seed layer deposited on the lower electrode.

17. The method of claim 15, wherein the fixed magnetic layer is formed as a multilayer structure comprising plural fixed magnetic sublayers.

18. The method of claim 15, further comprising forming an upper electrode over the metal layer after oxidation of the metal layer.

19. The method of claim 1, wherein the metal layer is formed to include at least one of tantalum, zirconium, titanium, vanadium, yttrium, scandium, molybdenum, magnesium, and cobalt.

* * * * *